(12) United States Patent
Inagawa et al.

(10) Patent No.: US 7,442,900 B2
(45) Date of Patent: Oct. 28, 2008

(54) CHAMBER FOR UNIFORM HEATING OF LARGE AREA SUBSTRATES

(75) Inventors: Makoto Inagawa, Palo Alto, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 269 days.

(21) Appl. No.: 11/396,477

(22) Filed: Apr. 3, 2006

(65) Prior Publication Data

US 2006/0169210 A1 Aug. 3, 2006

Related U.S. Application Data

(62) Division of application No. 10/607,557, filed on Jun. 25, 2003, now abandoned.

(51) Int. Cl.
  F27B 5/14 (2006.01)
  C23C 16/00 (2006.01)
  C23C 16/54 (2006.01)
  H01L 21/324 (2006.01)

(52) U.S. Cl. .................. 219/390; 219/392; 219/398; 118/719; 118/724; 118/725

(58) Field of Classification Search .................. None
See application file for complete search history.

(56) References Cited

U.S. PATENT DOCUMENTS

| | | | |
|---|---|---|---|
| 3,832,815 A | 9/1974 | Balaz et al. | |
| 4,386,225 A | 5/1983 | Berkman et al. | |
| 4,736,508 A | 4/1988 | Poli et al. | |
| 4,848,814 A | 7/1989 | Suzuki et al. | |
| 4,958,061 A | 9/1990 | Wakabayashi et al. | |
| 4,979,464 A | 12/1990 | Kunze-Concewitz et al. | |
| 5,259,881 A | 11/1993 | Edwards et al. | |
| 5,445,486 A | 8/1995 | Kitayama et al. | |
| 5,595,241 A | 1/1997 | Jelinek | |
| 5,605,574 A | 2/1997 | Tsunashima et al. | |
| 5,607,009 A | 3/1997 | Turner et al. | |
| 5,674,786 A | 10/1997 | Turner et al. | |
| 5,677,824 A | 10/1997 | Harashima et al. | |
| 5,716,207 A | 2/1998 | Mishina et al. | |
| 5,718,574 A | 2/1998 | Shimazu | |
| 5,788,304 A | 8/1998 | Korn et al. | |
| 5,836,575 A | 11/1998 | Robinson et al. | |

(Continued)

FOREIGN PATENT DOCUMENTS

JP 9-129567 5/1997

(Continued)

*Primary Examiner*—Joseph M Pelham
(74) *Attorney, Agent, or Firm*—Patterson & Sheridan, LLP (57) ABSTRACT

Embodiments of the present invention generally provide an apparatus for providing a uniform thermal profile to a plurality of large area substrates during thermal processing. In one embodiment, an apparatus for thermal processing large area substrates includes a chamber having a plurality of processing zones disposed therein that are coupled to a lift mechanism. The lift mechanism is adapted to vertically position the plurality of processing zones within the chamber. Each processing zone further includes an upper heated plate, a lower heated plate adapted to support a first substrate thereon and an unheated plate adapted to support a second substrate thereon, wherein the unheated plate is disposed between the upper and lower heated plates.

20 Claims, 6 Drawing Sheets

U.S. PATENT DOCUMENTS

| | | | |
|---|---|---|---|
| 5,844,205 | A | 12/1998 | White et al. |
| 5,850,071 | A | 12/1998 | Makiguchi et al. |
| 5,884,009 | A | 3/1999 | Okase |
| 5,931,631 | A | 8/1999 | Bonora et al. |
| 5,984,391 | A | 11/1999 | Vanderpot et al. |
| 6,035,101 | A | 3/2000 | Sajoto et al. |
| 6,046,435 | A | 4/2000 | Holden et al. |
| 6,062,852 | A | 5/2000 | Kawamoto et al. |
| 6,077,026 | A | 6/2000 | Shultz |
| 6,085,670 | A | 7/2000 | Genov |
| 6,087,632 | A | 7/2000 | Mizosaki et al. |
| 6,091,498 | A | 7/2000 | Hanson et al. |
| 6,110,285 | A | 8/2000 | Kitazawa et al. |
| 6,143,147 | A | 11/2000 | Jelinek |
| 6,146,504 | A | 11/2000 | Patadia et al. |
| 6,187,134 | B1 | 2/2001 | Chow et al. |
| 6,193,506 | B1 | 2/2001 | Muka |
| 6,213,704 | B1 | 4/2001 | White et al. |
| 6,256,555 | B1 | 7/2001 | Bacchi et al. |
| 6,257,827 | B1 | 7/2001 | Hendrickson et al. |
| 6,276,072 | B1 | 8/2001 | Morad et al. |
| 6,322,116 | B1 | 11/2001 | Stevens |
| 6,343,183 | B1 | 1/2002 | Halpin et al. |
| 6,345,150 | B1 | 2/2002 | Yoo |
| 6,371,716 | B1 | 4/2002 | Byun et al. |
| 6,399,923 | B2 | 6/2002 | Kano et al. |
| 6,414,276 | B1 | 7/2002 | Babikian |
| 6,506,994 | B2 | 1/2003 | Wang et al. |
| 6,610,967 | B2 | 8/2003 | Gat |
| 6,688,375 | B1 | 2/2004 | Turner et al. |
| 6,723,964 | B2 | 4/2004 | Hwang et al. |
| 6,765,178 | B2 | 7/2004 | Shang et al. |
| 6,897,411 | B2 | 5/2005 | Beer et al. |
| 2002/0086260 | A1 | 7/2002 | Shang et al. |
| 2002/0175160 | A1 | 11/2002 | Bagley et al. |
| 2003/0067180 | A1 | 4/2003 | Hosokawa |
| 2003/0072639 | A1 | 4/2003 | White et al. |
| 2004/0065656 | A1 | 4/2004 | Inagawa et al. |

FOREIGN PATENT DOCUMENTS

| | | |
|---|---|---|
| JP | 2000-091406 | 3/2000 |
| JP | 2000-150402 | 5/2000 |

CHAMBER FOR UNIFORM HEATING OF LARGE AREA SUBSTRATES

CROSS REFERENCE RELATED PATENT APPLICATIONS

This application is a divisional of U.S. patent application Ser. No. 10/607,557 filed Jun. 25, 2003 now abandoned, which is herein incorporated by reference.

BACKGROUND OF THE INVENTION

1. Field of the Invention

Embodiments of the invention generally relate to an apparatus for heating large area substrates in a processing system.

2. Background of the Related Art

In the fabrication of flat panel displays, transistors and liquid crystal cells, metal interconnects and other features are formed by depositing and removing multiple layers of conducting, semiconducting and dielectric materials from a glass substrate. Processing techniques include plasma-enhanced chemical vapor deposition (PECVD), physical vapor deposition (PVD), etching, and the like. Plasma processing is particularly well suited for the production of flat panel displays because of the relatively lower processing temperatures required to deposit film on glass substrates and good film quality which results from plasma processes.

An exemplary type of flat panel display film is amorphous silicon (α-Si), which is used for PDA's, cell phone displays, monitors, big screen televisions, and the like. A heat treatment step is required in amorphous silicon film processing to remove moisture from the glass substrate after deposition. For example, a heat treatment step for amorphous silicon film includes heating the film disposed on the glass substrate to a temperature of up to about 400 degrees Celsius. Thus, cluster tools configured to process glass substrates may include heat treatment chambers to enhance the properties of deposited films.

Typically, heat treatment chambers thermally process one or more substrates through a combination of gas convection and heat radiation. Unfortunately, as the chamber walls and other internal chamber components provide conduction paths within the chamber, temperature control is difficult due to heat losses and gas convection currents within the heat treatment chamber. This combination of heat losses and convection currents creates a constantly fluctuating substrate-heating environment that prevents uniform heating of the substrate. Additionally, as the size of glass substrate is increased, the heat loss and convection current effects on substrate heating uniformity become more pronounced, which results in non-uniform temperature across the width of a single glass substrate, along with substrate to substrate variation, which impedes process repeatability.

Moreover, heat treatment chambers are often very big to accommodate the long edges of the large area substrate further exacerbating the heating issues by increasing the area and volume to be heated. For example, as the demand for larger computer displays, monitors, flat-screen televisions, and the like increases, the sizes of large area glass substrates upon which these devices are fabricated have increased from about 500×650 mm to about 1500×1800 mm over just a few years, and are envisioned as even larger. As these long substrate edges have faster rates of heat loss as compared to the center of the substrate, uniform heating of these increasingly larger area substrates is particularly difficult to achieve. Thus, traditional heat treatment chambers and heating processes do not provide acceptably uniform substrate heating for an efficient and cost effective heating process.

Therefore, there is a need for an improved apparatus for uniform heat processing of a plurality of substrates in a processing system.

SUMMARY OF THE INVENTION

Embodiments of the present invention generally provide an apparatus for providing a uniform thermal profile to a plurality of large area substrates during thermal processing. In one embodiment, an apparatus for thermal processing large area substrates includes a chamber having a plurality of processing zones disposed therein that are coupled to a lift mechanism. The lift mechanism is adapted to vertically position the plurality of processing zones within the chamber. Each processing zone further includes an upper heated plate, a lower heated plate adapted to support a first substrate thereon and an unheated plate adapted to support a second substrate thereon, wherein the unheated plate is disposed between the upper and lower heated plates.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention have particular advantages in a multi-chamber processing system, also known as a cluster tool, commonly used in the semiconductor industry and well suited for supporting a substrate heat treatment chamber described herein. A cluster tool is a modular system comprising multiple chambers that perform various functions that may include substrate heating, center-finding and orientation, degassing, annealing, deposition and/or etching. The multiple processing chambers are mounted to a central transfer chamber which houses a robot adapted to shuttle substrates between the processing chambers. The transfer chamber is typically maintained at a vacuum condition and provides an intermediate stage for shuttling substrates from one chamber to another and/or to a load lock chamber positioned at a front end of the cluster tool.

Figure 1:
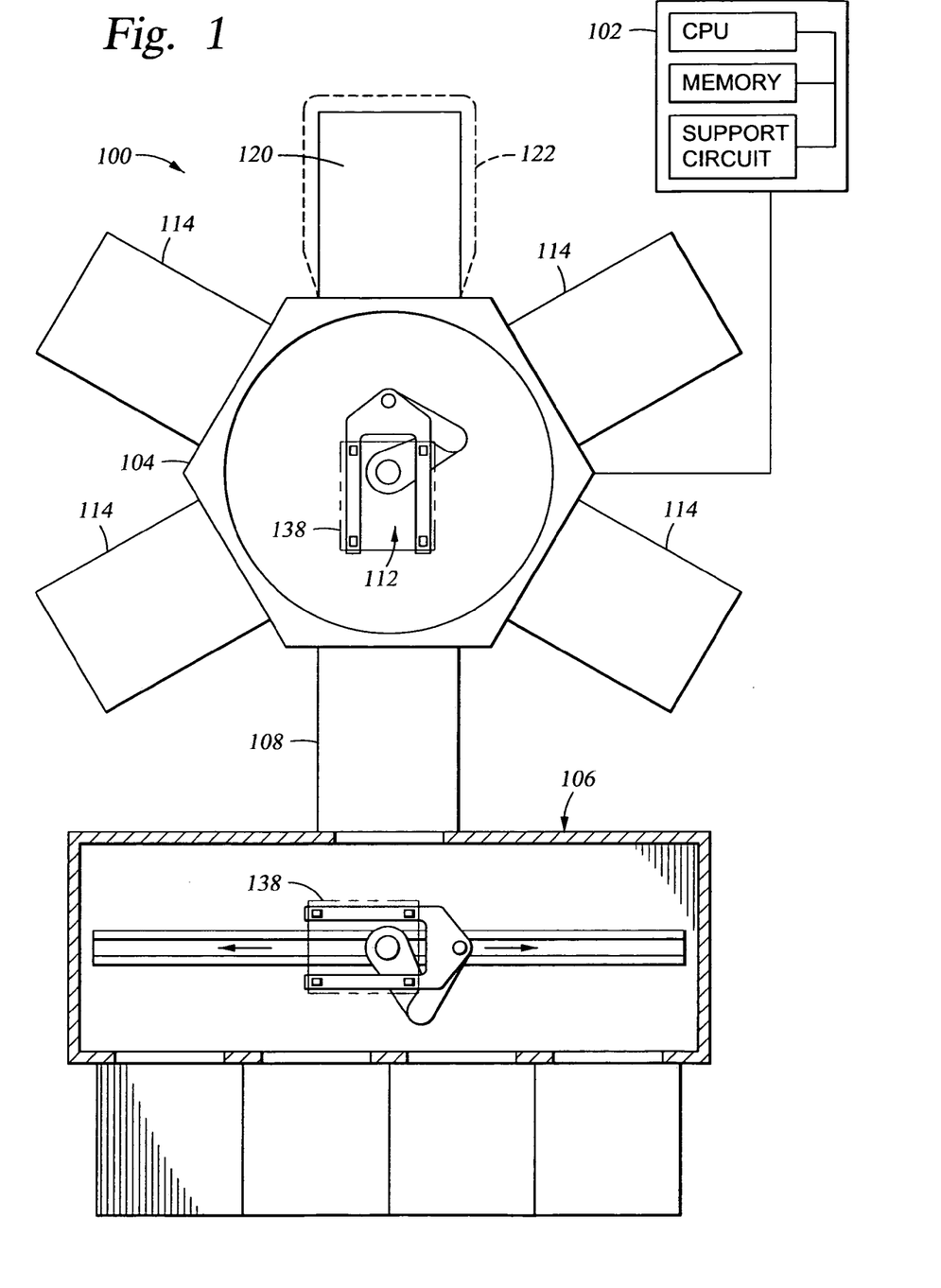
FIG. 1 is a plan view of a processing system including a heat treatment chamber of the present invention.

FIG. 1 is a plan view of an exemplary processing system 100 for semiconductor processing having a heat treatment chamber 120 of the present invention. The processing system 100 generally comprises a plurality of processing chambers 114 circumscribing a central transfer chamber 104 and includes a controller 102 programmed to provide instructions that enable the processing system 100 to perform substrate transfers and various processing functions performed by the system 100. A factory interface or front-end environment 106 is positioned in selective communication with a load lock chamber 108. Pod loaders (not shown) disposed in the front-end environment 106 may be capable of linear, rotational, and vertical movement to shuttle substrates between the load lock chamber 108 and a plurality of pods mounted on the front-end environment 106.

The load lock chamber 108 provides a first vacuum interface between the front-end environment 106 and a transfer chamber 104. In one embodiment, several load lock chambers 108 may be stacked to provide increased throughput by alternatively communicating with the transfer chamber 104 and the front-end environment 106 to allow processed and unprocessed substrates to be transferred through the respective chambers 108.

A robot 112 is centrally disposed in the transfer chamber 104 to transfer substrates between the load lock chamber 108, the heat treatment chamber 120 and the various processing chambers 114 circumscribing the transfer chamber 104. The processing chambers 114 may be adapted to perform any number of processes such as amorphous silicon deposition, physical vapor deposition, chemical vapor deposition, and etching, among other processes.

The heat treatment chamber 120 is used to thermally treat substrates by processes such as moisture removal, annealing, preheating and the like. The heat treatment chamber 120 may be coupled to the transfer chamber 104 at the most efficient position for processing, but may alternatively be located anywhere within processing system 100. For example, a heating process step performed in the heat treatment chamber 120 may follow a deposition process step performed in one of the processing chambers 114 furthest from the load lock chamber 108. Therefore, to minimize the movement of the robot 112 when transferring a substrate between the deposition and heating steps, the heat treatment chamber 120 may be located adjacent to one of the processing chambers 114 used for the deposition process step.

Figure 2:
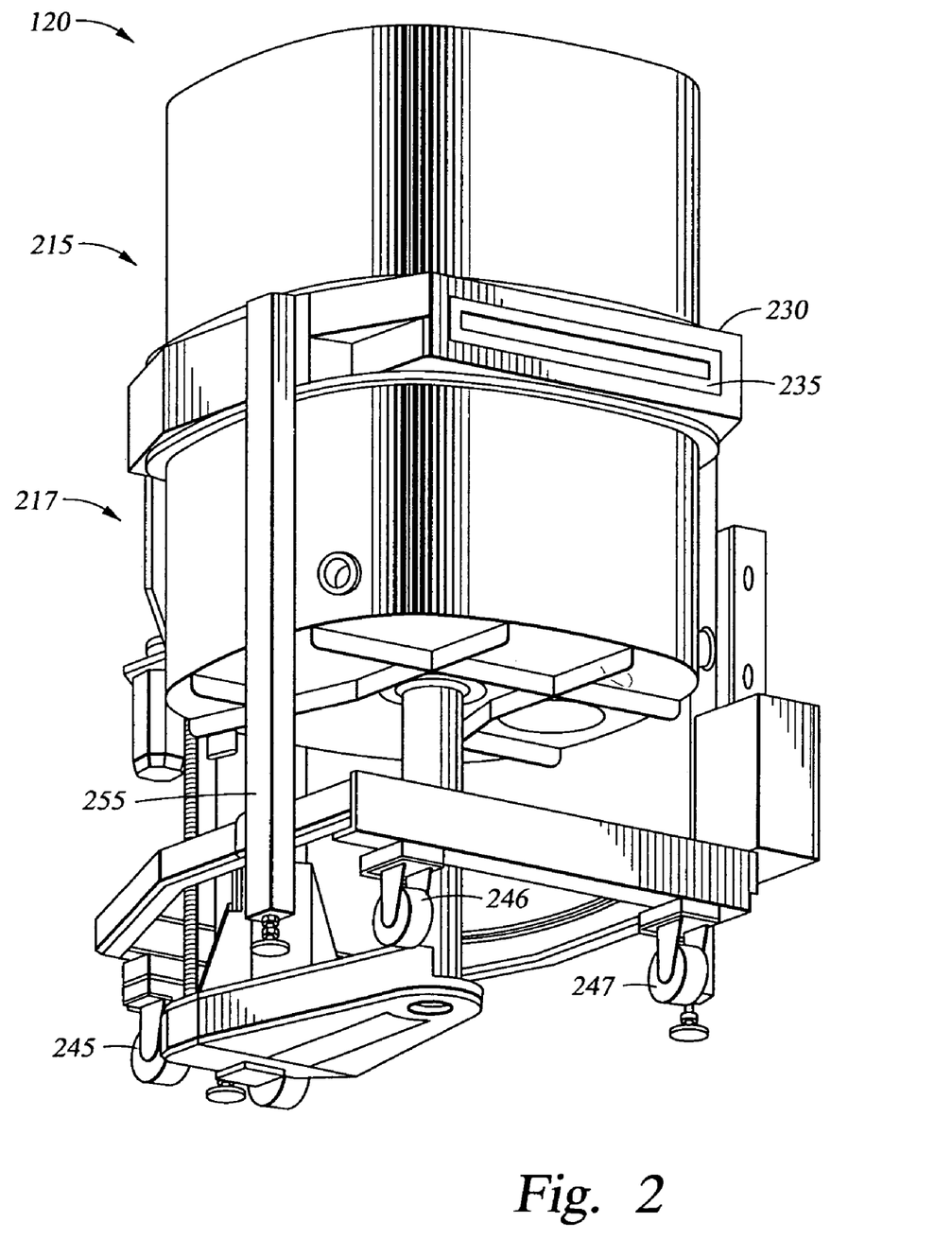
FIG. 2 is a perspective view of one embodiment of a heat treatment chamber.

FIG. 2 is a perspective view of one embodiment of a heat treatment chamber 120 comprising an upper section 215 (e.g., upper bell jar) and a lower section 217 (e.g., lower bell jar) sealingly coupled by a connecting body 230 having a loading window 235. In one embodiment, the upper and lower sections 215, 217 may be symmetrical and coaxial with the connecting body 230.

The heat treatment chamber 120 is supported on a mounting frame 255 to provide support for the upper section 215 and lower section 217. The mounting frame 255 is coupled to rotatably mounted casters 245, 246, and 247 on a lower end for moving the heat treatment chamber 120. The mounting frame 255 may be attached to the heat treatment chamber 120 and connecting body 230 by conventional fastening means such as bolts, clamps, welding or other fastening methods. While the heat treatment chamber 120 is shown mounted on frame 255, the heat treatment chamber 120 may alternatively be mounted to and supported by the transfer chamber 104 using fasteners such as screws, bolts, clips, and the like.

In one embodiment, a thermal insulating layer 122 (shown in phantom in FIG. 1) may be used to enclose, or wrap, the heat treatment chamber 120 to minimize heat loss from the heat treatment chamber 120. The thermal insulating layer 122 may comprise insulators such as fiberglass, ceramic fiber, asbestos, and the like. In one embodiment, the insulating layer 122 comprises a flexible insulating ceramic fiber blanket having a thermal conductivity of less than about 0.035 watt/m-degree Kelvin and stabilizes at a surface temperature of about 30 degrees Celsius.

Figure 3:
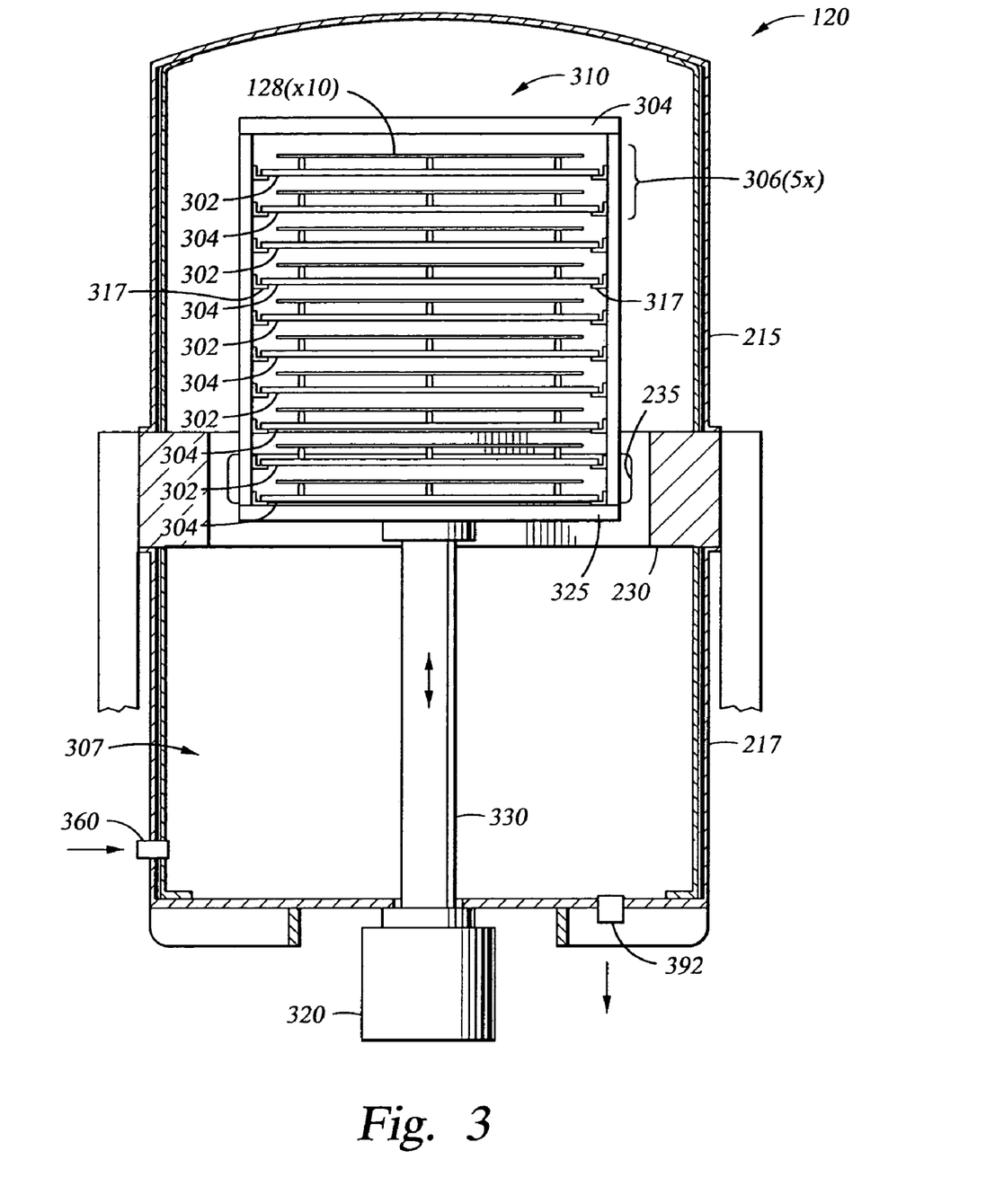
FIG. 3 is a vertical sectional view of the heat treatment chamber of FIG. 2.

FIG. 3 is a vertical sectional view of the heat treatment chamber 120. The upper section 215, lower section 217 and a connecting body 230 of the heat treatment chamber 120 define a cavity 307 for heating a plurality of substrates 128 therein. The upper, lower sections 215, 217 and body 230 may be fabricated from materials such as aluminum, steel, nickel, cast iron, and the like. The lower section 217 includes a gas inlet 360 for delivery of processing gases into the cavity 307. A vacuum pump (not shown) is coupled to the cavity 307 through a vacuum port 392 to control the pressure within the cavity 307.

A substrate cassette 310 is moveably disposed within the cavity 307 and is coupled to an upper end of a shaft 330. The shaft 330 is slidably and sealably disposed through the bottom of the lower section 217 and is raised and lowered by a lift mechanism 320. The shaft 330 vertically moves the cassette 310 within the cavity 307 to align selected substrates 128 retained in the cassette 310 with the window 235. The substrate 128 aligned with the window 235 may be moved out of the cassette 310 by the robot 113. Substrates are returned to the cassette 310 in a similar fashion.

The cassette 310 includes a plurality of lateral plates 302, 304 supported by a frame 325. The lateral plates 302 are unheated while the lateral plates 304 are heated. In one embodiment, at least one of the unheated lateral plates 302 are disposed between each pair of heated lateral plates 304. In this configuration, each pair of heated lateral plates defines a temperature controlled processing zone 306. As each of the plates 302, 304 (except the uppermost heating plate) supports one substrate 128, each zone 306 is configured to accommodate at least two substrates. Although FIG. 3 illustrates five (5) processing zones 306 within cassette 310, any number of processing zones 306 may be provided.

Each of the plates 302, 304 are connected by brackets 317 on opposing ends to the frame 325. The brackets 317 may be attached to both the frame 325 and plates 302, 304 using adhesives such as pressure sensitive adhesives, ceramic bonding, glue, and the like, or fasteners such as screws, bolts, clips, and the like. The frame 325 and brackets 317 may be fabricated from materials such as aluminum, steel, nickel, cast iron, and the like. While the frame 325 and brackets 317 may be separate items, it is contemplated that the brackets may be integral to the frame 325 to form support members for the plates 302, 304. While it is shown that the plates 302, 304 are conformal and slightly larger than the substrates to maximize heating efficiency and temperature uniformity in each zone 306, it is contemplated that the plates 302, 304 may be of any shape adapted to provide desired substrate heating.

Figure 4A:
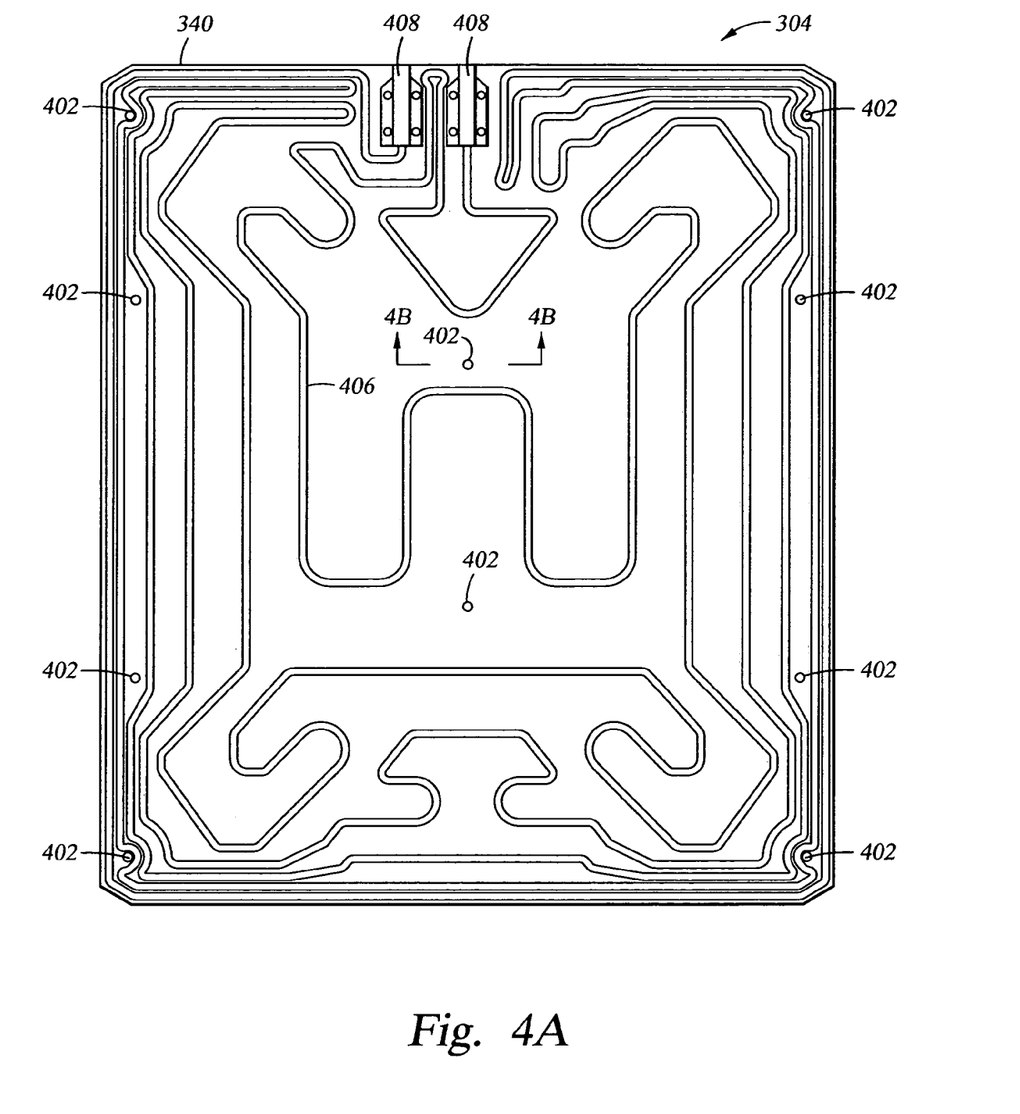
FIG. 4A is a plan view of one embodiment of a heated plate.
Figure 4B:
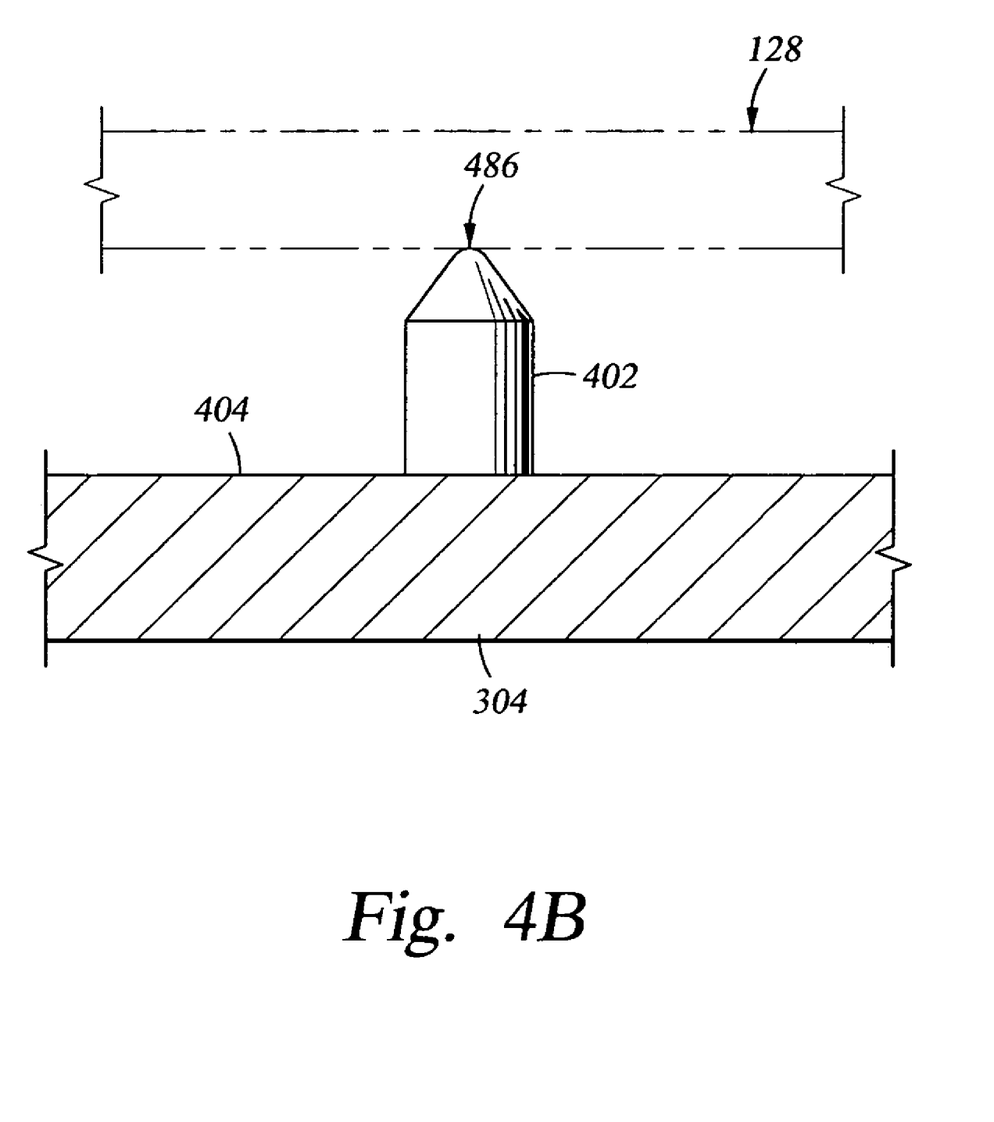
FIG. 4B is a partial sectional view of the heated plate of FIG. 4A.

In the embodiment depicted in FIG. 3, the processing zones 306 are spaced vertically apart and substantially parallel within the cassette 310. Each processing zone is adapted to heat two substrates 128 therein, a first substrate supported on a lower heated plate 304 of the zone 306, and a second substrate supported on an unheated plate 302 positioned in the vertical center of the zone 306. The heated plates 304 above and below the two substrates 128 disposed in the processing zone 306 establish the upper and lower boundary of the zone 306 such that only one side of each substrate 128 is facing one of the heated plates 304 while the other side of the substrate faces an unheated plate 302. In one embodiment, the upper and lower boundaries of the zone 306 (i.e., the adjacent heated plates 304) are equidistant from the unheated plate 306 in order to ensure uniform heating of the substrates within that zone 306. To ensure heating of the top substrate in the cassette 310, the upper boundary for the top processing zone 306 is a heated plate 304 that does not support a substrate. FIGS. 4A-B are top plan and partial sectional views of one embodiment of the heated plate 304. The heated plate 304 includes a plurality of support pins 402 extending therefrom, spacing and supporting the substrate 128 (shown in phantom in FIG. 4B) thereon in a spaced-apart relation to an upper surface 404 of the plate 402. In one embodiment, four support pins 402 are spaced substantially uniformly around the perimeter of the heated plate 304 to support the outer periphery of the substrate 128 and two support pins (not shown) adjacent the middle of the plate 304 to support the center of the substrate. It is also contemplated that any number of support pins 402 may be used in any configuration adapted to support the substrate 128. The supporting pins 402 may be fabricated from thermal insulators such as polymers, ceramics, and the like, with a cross-section adapted to minimize contact with the substrate 128 and to prevent conduction between the heated plate 304 and the substrate 128. Alternatively, supporting pins 402 may be fabricated from conductors, such as steel, aluminum, nickel and the like, having a sufficiently small sectional area to minimize conduction between the substrate 128 and the heated plate 304. In one embodiment, the support pins 402 have a pointed tip 486 to minimize contact with substrate 128, but may alternatively have other tip geometry and cross-section, such as a rounded tip, square tip, flat tip, and the like.

The heated plate 304 includes at least one plate heater 406. The heater 406 may be disposed within a layer of thermally and electrically insulating material such as fiberglass, glass, ceramic, asbestos, and the like. The plate heater 406 may be a resistive heating element, a radiant lamp, a conduit for circulating a heat transfer fluid, and the like. In the embodiment depicted in FIGS. 4A-B, the plate heater 406 is a resistive heating element coupled through connectors 408 to a power source (not shown).

Typically, the temperature across the substrate surfaces varies as a function of the substrate body heat migration due to convection and conduction within the chamber 120, proximity to the heated plate 304, the support pins 402, the plate heaters 406, and the overall thermal profile within the cavity 307. In one embodiment, the plate heater 406 is patterned to provide a radiant heating profile to match and compensate for substrate thermal losses, i.e. the substrate heat loss profile. For example, the plate heater 406 illustrated in FIG. 4A has a greater density (i.e., greater heating capacity) near the corners and along the edges than in the middle of the heated plate 304, thereby providing more concentrated heat to the corners and edges of the substrate 128 where a substantial amount of heat loss occurs. Although heat typically tends to radiate from the substrate edges, it is contemplated that the patterned heating profile may be adapted to encompass any variation in the substrate heat loss profile. For example, the plate heater 406 may be adapted to provide a variable amount of heat output by varying its size, spacing, resistivity, illumination, input power, and the like, to more closely fit the substrate heat loss profile. Additionally, as the heated plate 304 is spaced from the substrate 128 by the support pins 402, the heat radiated between the lower surface of the substrate 128 and upper surface of the heated shelf 304 intermixes before heating the substrate 128, thereby minimizing the effect of any hotspots which may be present in a given plate heater configuration. Alternatively, it is contemplated that the substrate 128 may be laid directly on a heated plate 304 with plate heater 406 adapted to substantially match the substrate heat loss profile.

Figure 5:
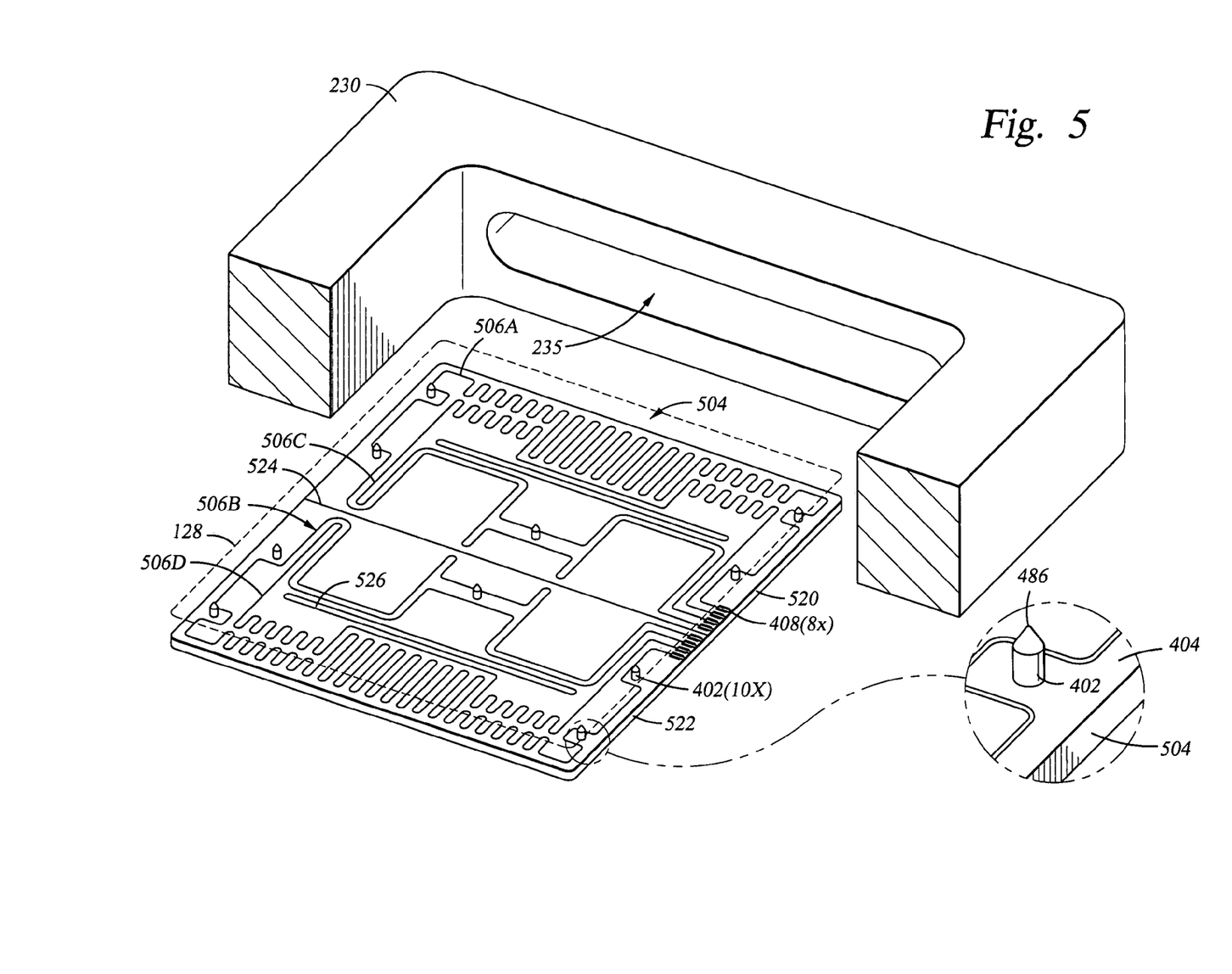
FIG. 5 is a perspective view of one embodiment of a heated shelf.

FIG. 5 is a top perspective view of another embodiment of a heated plate 504. The heated plate 504 is configured similar to the heated plate 304, except that the plate 504 includes a plurality of heating zones distributed laterally across the heated plate 504 to provide additional resolution to the heating profile of the heated plate 504.

The heated plate 504 includes at least one plate heater. In the embodiment depicted in FIG. 5, first and second outer plate heaters 506A, 506B and first and second inner plate heaters 506C, 506D are shown and collectively referred to as plate heaters 506. The heaters 506 may be disposed within a layer of thermally and electrically insulating material such as fiberglass, glass, ceramic, asbestos, and the like, and may comprise resistive heaters, radiant lamps, conduits for transferring a heat transfer fluid, and the like.

In one embodiment, the plate heaters 506 are patterned to provide a radiant heating profile to match and compensate for substrate thermal losses, i.e. the substrate heat loss profile. For example, the outer plate heaters 506A, 506B illustrated in FIG. 5 are spaced closer together (e.g., has greater heating density) near the corners and along the center than in the middle of the heated plate 504, while the inner plate heaters 506C, 506D are less densely spaced, thereby providing more concentrated heat to the corners and edges of the substrate 128 where a substantial amount of heat loss occurs.

Alternatively, the plate heaters 506 may be adapted to provide a variable amount of heat output by varying their size, spacing, resistivity, illumination, input power, and the like to more closely fit the substrate heat loss profile. For example, greater power may be applied to the outer plate heaters 506A, 506B than the inner heaters 506C, 506D.

In one embodiment, the heated plate 504 may be fabricated from one or more plate elements to further control the heat transfer attributes of the heated plate 504. In the embodiment depicted in FIG. 5, the heated plate 504 is fabricated from a first plate 520 and a second plate 522 that meet along a seam 524. The reduced heat transfer between the plates 520, 522 across the seam 524 enables multi-zone temperature control to be realized. The plates 520, 522 may be flush when defining the seam 524, or the seam 524 may include a gap. Since heat loss of a surface of the heat treatment chamber 120 that is coupled to the transfer chamber 104 may be different from the other side where no mating surface exists, for example, the portion of the heated plate 504 adjacent the portion of the connecting body 130 having the window 235 which mates with the transfer chamber 104, the multi-zone temperature control on each heated plate 504 achieves improved thermal uniformity over conventional designs. In addition, since heat loss of upper and lower sections of the heat treatment chamber is different, temperature set of one heated plate 504 may be different than another heat plate 504 positioned in a different elevation within the cassette 310. Multi-processing zone temperature control with independent temperature control across the heated plate 504 enables efficient use of heaters that reduce the system cost without sacrificing thermal uniformity performance.

Each of the plates 520, 522 may include one or more slots 526 formed therethrough. The slots 526 prevent conduction between adjacent portions of each plate 520, 522 to further control the temperature distribution and heating of the substrate by the heated plate 504.

It is contemplated that the use multi-zone temperature control may be realized in the embodiment of FIGS. 4A-B through the use of multiple plate members or slots in the heating plate, or combinations thereof. It is also contemplated that the unheated plate 302 may augment the zonal temperature control through the use of multiple plate members or slots in the unheated plate, or combinations thereof, in any of the above embodiments.

In one embodiment of a mode of operation, the heat treatment chamber 120 heating process is initiated by the robot 112 placing the substrate 128 via window 235 on a heated plate member 504 (or an unheated plate 302). The chamber 120 is evacuated through the port 392 to a vacuum level of about 0 to about 0.5 Torr while a process gas such as nitrogen or other inert gas is flowed into chamber 120 through the gas inlet port 360. The substrates 128 in each zone 306 defined in the cassette 310 are thermally treated via heaters 506 disposed on the heated plates 304 to heat the substrates to a temperature of about 420 degrees Celsius. The substrates 128 are generally maintained at about plus or minus 20 degrees Celsius of about 420 degrees Celsius across the width.

Thus, various embodiments of an apparatus for thermally treating a substrate have been provided. The efficient use of zone heating both in the cassette and on the heated plates provides a uniform substrate temperature profile that enhances substrate processing and process repeatability. Moreover, the improved substrate heating allows for less heated plates per substrate to be utilized in a cassette, thereby reducing systems hardware costs and complexity.

While the foregoing is directed to the preferred embodiment of the present invention, other and further embodiments of the invention may be devised without departing from the basic scope thereof, and the scope thereof is determined by the claims that follow.

What is claimed:

1. A method for thermally processing large area substrate, comprising:
   providing an upper plate in direct contact with a first heater;
   providing a lower plate in direct contact with an second heater;
   supporting a first substrate on the lower plate;
   providing a plate not in direct contact with a heater, wherein the plate not in direct contact with a heater is disposed between the upper and lower plates;
   supporting a second substrate on the plate not in direct contact with a heater;
   and activating the first and second heaters.

2. The method of claim 1, wherein each of the upper plate and the lower plate comprises a first and a second heating elements.

3. The method of claim 2, wherein the first and second elements are independently controllable.

4. The method of claim 2, wherein the first heating element is positioned along edges of the respective plate and the second heating element is positioned inside the first heating element.

5. The method of claim 4, wherein the first heating element has a greater heating capacity than the second heating element.

6. The method of claim 1, further comprising generating a temperature controlled processing zone between the upper plate and the lower plate.

7. The method of claim 1, further comprising providing a plurality of support pins extending from the lower plate and the plate not in direct contact with a heater to support the first and second substrates.

8. A method for thermally processing large area substrates, comprising: providing at least three vertically stacked plates in a chamber, wherein each of the at least three vertically stacked plates is configured to support one large area substrate;
   positioning the large area substrates on the at least three vertically stacked plates; and
   heating by direct heater contact only every other one of the at least three vertically stacked plates.

9. The method of claim 8, wherein only every other one of the at least three vertically stacked plates comprises heating elements.

10. The method of claim 9, wherein the heating elements forms at least two independently controllable heating zones.

11. The method of claim 8, further comprising providing a plurality of support pins extending from each of the three vertically stacked plates, wherein the plurality of support pins are configured to support the large area substrate.

12. The method of claim 11, wherein the plurality support pins are fabricated from a thermal insulator.

13. The method of claim 8, wherein heating by direct heater contact only every other one of the at least three vertically stacked plates comprises providing greater heat along edges of the vertically stacked plates than near centers of the vertically stacked plates.

14. A method for thermally processing large area substrates, comprising:
    generating a processing zone in a chamber, wherein the processing zone comprises an upper plate in direct contact with a first heater and a lower plate in direct contact with a second heater;
    providing a plate not in direct contact with a heater between the upper plate and the lower plate;
    positioning the large area substrates on the lower plate and the plate not in direct contact with a heater of the processing zone; and
    activating the first and second heaters.

15. The method of claim 14, further comprising generating a plurality of processing zones vertically stacked together.

16. The method of claim 15, wherein the upper heating plate of a first processing zone is the lower heating plate of a second processing zone positioned above the first processing zone.

17. The method of claim 15, wherein the plurality of processing zones are formed by a plurality of vertically stacked plates in direct contact with a heater.

18. The method of claim 14, wherein each of the upper heating plate and the lower heating plate comprises a first heating zone and a second heating zone.

19. The method of claim 18, wherein the first and second heating zones are independently controllable.

20. The method of claim 18, further comprising providing a first heating element in the first heating zone and a second heating element in the second heating zone.

* * * * *